(12) United States Patent
Park et al.

(10) Patent No.: US 8,274,093 B2
(45) Date of Patent: Sep. 25, 2012

(54) SEMICONDUCTOR LIGHT EMITTING DEVICE AND METHOD OF FABRICATING THE SAME

(75) Inventors: Hyung Jo Park, Gwangju (KR); Dae Sung Kang, Gwangju (KR); Hyo Kun Son, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 328 days.

(21) Appl. No.: 12/676,844

(22) PCT Filed: Sep. 5, 2008

(86) PCT No.: PCT/KR2008/005265
§ 371 (c)(1),
(2), (4) Date: Mar. 5, 2010

(87) PCT Pub. No.: WO2009/031857
PCT Pub. Date: Mar. 12, 2009

(65) Prior Publication Data
US 2010/0252850 A1    Oct. 7, 2010

(30) Foreign Application Priority Data
Sep. 6, 2007    (KR) ................. 10-2007-0090416

(51) Int. Cl.
*H01L 33/00* (2010.01)
*H01L 21/00* (2006.01)
(52) U.S. Cl. ........... 257/98; 257/E33.005; 257/E33.067; 438/29

(58) Field of Classification Search ............... 257/98, 257/99, E33.005, E33.067; 438/29
See application file for complete search history.

(56) References Cited

U.S. PATENT DOCUMENTS

| 7,489,068 B2 | 2/2009 | Hsieh et al. |
|---|---|---|
| 2002/0163688 A1 | 11/2002 | Zhu |
| 2002/0173089 A1 | 11/2002 | Zhu |
| 2003/0146442 A1 | 8/2003 | Dawson et al. |
| 2003/0168667 A1 | 9/2003 | Shigihara et al. |
| 2004/0113166 A1 | 6/2004 | Tadatomo et al. |
| 2005/0145873 A1 | 7/2005 | Pan et al. |
| 2005/0221521 A1 | 10/2005 | Lee et al. |
| 2006/0118803 A1 | 6/2006 | Lee et al. |

FOREIGN PATENT DOCUMENTS

| CN | 1444317 A | 9/2003 |
|---|---|---|
| CN | 1674307 A | 9/2005 |
| KR | 10-2003-0093265 A | 12/2003 |
| KR | 10-2006-0086272 A | 7/2006 |
| WO | WO 99/53578 A1 | 10/1999 |
| WO | WO 2007/063833 A1 | 6/2007 |

*Primary Examiner* — David S Blum
(74) *Attorney, Agent, or Firm* — Birch, Stewart, Kolasch & Birch, LLP

(57) ABSTRACT

Provided are a semiconductor light emitting device and a method of fabricating the same. The semiconductor light emitting device comprises a multireflection layer comprising at least one of reflection layers of different refractive indices, a first conductive semiconductor layer on the multireflection layers, an active layer on the first conductive type semiconductor layer, and a second conductive type semiconductor layer on the active layer.

20 Claims, 3 Drawing Sheets

[Fig. 1]
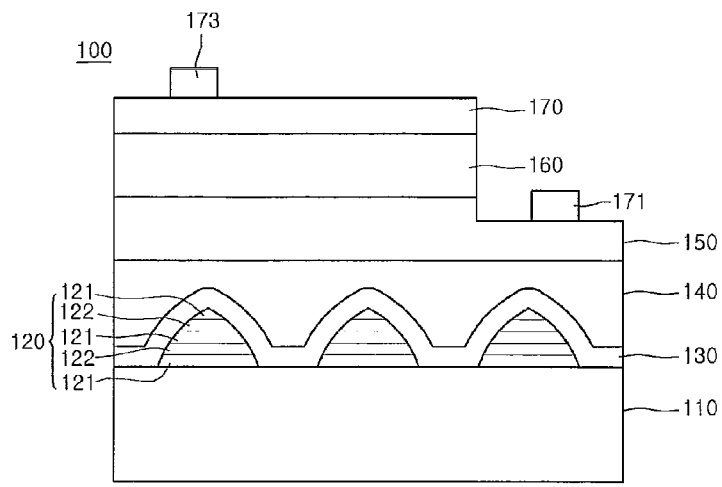
[Fig. 2]
[Fig. 3]
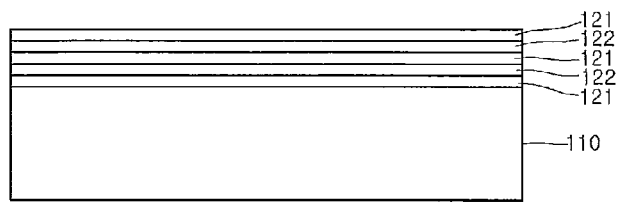
[Fig. 4]
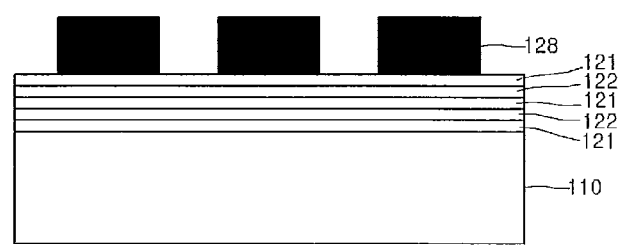
[Fig. 5]
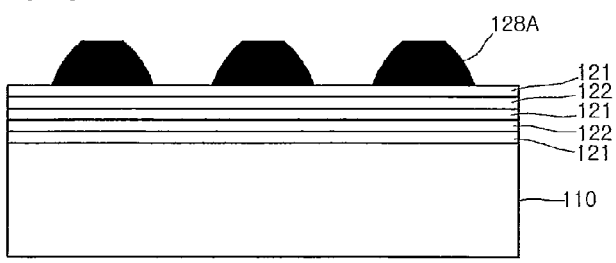

[Fig. 6]
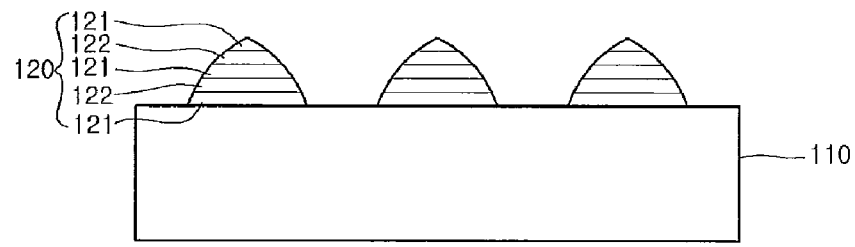
[Fig. 7]
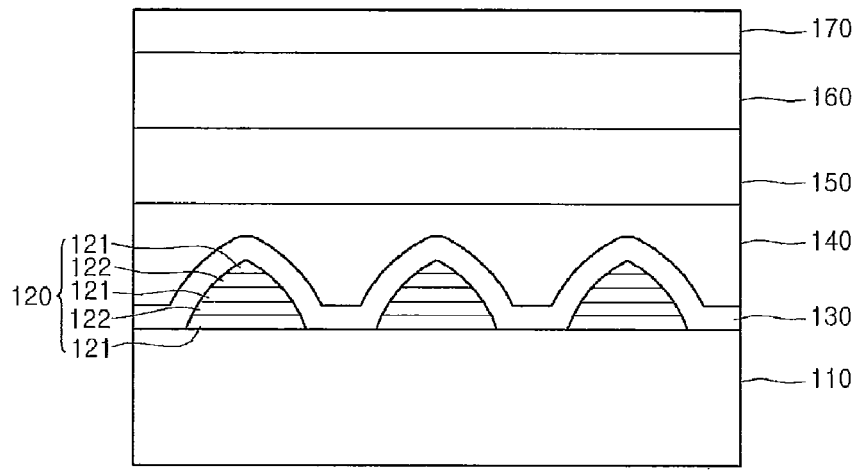
[Fig. 8]
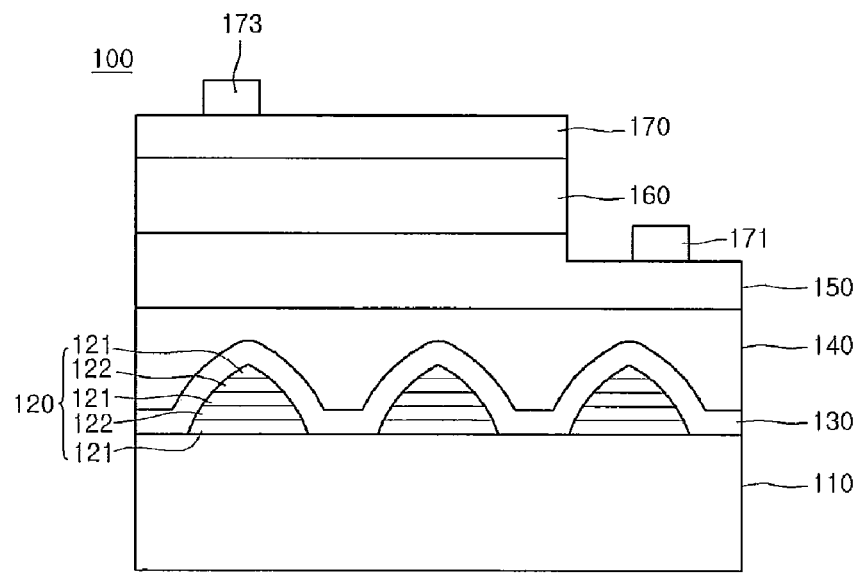

[Fig. 9]
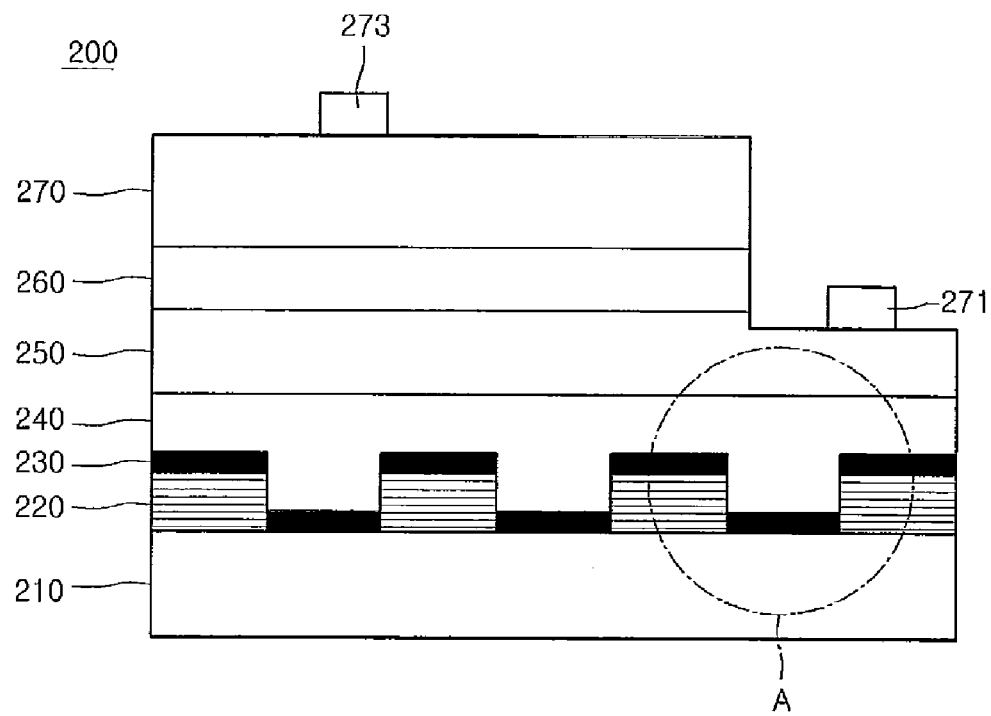
[Fig. 10]
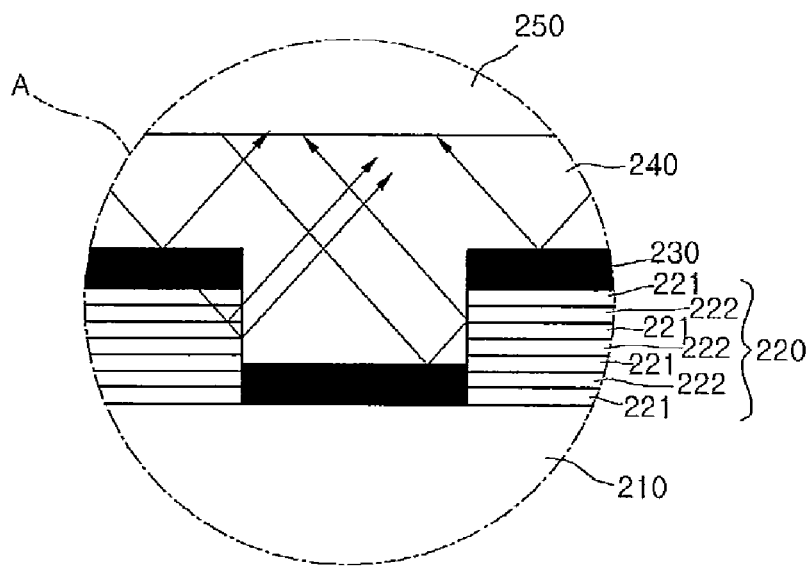

SEMICONDUCTOR LIGHT EMITTING DEVICE AND METHOD OF FABRICATING THE SAME

TECHNICAL FIELD

Embodiments relate to a semiconductor light emitting device and a method of fabricating the same.

BACKGROUND ART

Groups III-V nitride semiconductors have been variously applied to an optical device such as blue and green light emitting diodes (LED), a high speed switching device, such as a MOSFET (Metal Semiconductor Field Effect Transistor) and an HEMT (Hetero junction Field Effect Transistors), and a light source of a lighting device or a display device.

The nitride semiconductor is mainly used for the LED (Light Emitting Diode) or an LD (laser diode), and studies have been continuously conducted to improve the manufacturing process or a light efficiency of the nitride semiconductor.

DISCLOSURE OF INVENTION

Technical Problem

Embodiments provide a semiconductor light emitting device capable of improving external quantum efficiency using a multi-reflection layer, and a method of fabricating the same.

Embodiments provide a semiconductor light emitting device comprising a multi-reflection layer comprising a plurality of reflection layers with different refractive indices which are disposed under a first conductive type semiconductor layer, and a method of fabricating the same.

Technical Solution

An embodiment provides a semiconductor light emitting device comprising: a multi-reflection layer comprising at least one of reflection layers with different refractive indices a first conductive semiconductor layer on the multi-reflection layers an active layer on the first conductive type semiconductor layer; and a second conductive type semiconductor layer on the active layer.

An embodiment provides a method of fabricating a semiconductor light emitting device comprising: forming a multi-reflection layer with an uneven structure on a substrate, the multi-reflection layer comprising reflection layers comprising different refractive indices; forming a first conductive type semiconductor layer on the substrate and the multi-reflection layer; forming an active layer on the first conductive type semiconductor layer; and forming a second conductive semiconductor layer on the active layer.

Advantageous Effects

Embodiments can improve the external quantum efficiency of a semiconductor light emitting device.

Also, embodiments can improve the crystallinity of a semiconductor thin film by means of a multi-reflection layer having an uneven structure.

BRIEF DESCRIPTION OF THE DRAWINGS

FIG. 1 is a side sectional view illustrating a semiconductor light emitting device according to a first embodiment.

FIGS. 2 to 8 are views illustrating a method of fabricating the semiconductor light emitting device according to the first embodiment.

FIG. 9 is a side sectional view illustrating a semiconductor light emitting device according to a second embodiment.

FIG. 10 is an enlarged view of a portion A in FIG. 9.

BEST MODE FOR CARRYING OUT THE INVENTION

Reference will now be made in detail to the embodiments of the present disclosure, examples of which are illustrated in the accompanying drawings. In the description, a thickness of each layer in the accompanying drawings is exemplarily illustrated, and thus not limited thereto.

FIG. 1 is a side sectional view illustrating a semiconductor light emitting device 100 according to a first embodiment.

Referring to FIG. 1, the semiconductor light emitting device 100 comprises a substrate 110, a multi-reflection layer 120, a buffer layer 130, an undoped semi-conductor layer 140, a first conductive type semiconductor layer 150, an active layer 160, and a second conductive type semiconductor layer 170.

The substrate 110 may comprise at least one of a sapphire ($Al_2O_3$) substrate, a silicon carbide (SiC) substrate, a silicon (Si) substrate, a gallium arsenide (GaAs) substrate, a gallium nitride (GaN) substrate, a zinc oxide (ZnO) substrate, a gallium phosphide (GaP) substrate, an indium phosphide (InP) substrate, and a germanium (Ge) substrate. Alternatively, the substrate 110 may comprise a conductive substrate. The surface of the substrate 110 may have an uneven pattern, however, it is not limited thereto. The substrate 110 may be removed according to a mounting method of a light emitting device.

A multi-reflection layer 120 having an uneven structure is formed on the substrate 110. The multi-reflection layer 120 comprises a plurality of reflection layers 121 and 122 which are alternately stacked, and separated from each other by a predetermined distance. The multi-reflection layer 120 may be formed in a shape of a stripe or a lens, and may have a sectional shape of, for example, a hemisphere, a convex lens, a horn, or a polygon. However, the shape and section of the multi-reflection layer 120 may be variously modified within the scope of the embodiment.

The multi-reflection layer 120 comprises a pair of layers, e.g., the first and second reflection layers 121 and 122 having different refractive indices. Alternatively, the multi-reflection layer 120 may comprise a group of layers having 2-6 number of reflection layers. Further, the number of the first reflection layer 121 may be equal to or different from that of the second reflection layer 122.

The multi-reflection layer 120 may comprise 2-50 number of pairs of the first and second reflection layers 121 and 122. In the multi-reflection layer 120, the first and second reflection layers 121 and 122 differ in diameter from each other. For instance, the diameter (or length) of the lowermost first reflection layer 121 may be greater than the diameter of the uppermost first reflection layer 121. The diameter (or length) of the reflection layer 121 and 122 may gradually decrease from the bottom toward the top.

Each of the reflection layers 121 and 122 of the multi-reflection layer 120 are formed of at least one material of $SiO_2$, $Si_3N_4$, SiON, $TiO_2$, $Al_2O_3$, and ZrO. The first and second reflection layers 121 and 122 are formed of materials having different refractive indices.

The first reflection layer 121 may be formed of a material differing from a material used for the second reflection layer 122, or formed of a material of which a refractive index differs from that of the second reflection layer 122. For instance, a first refractive index of the first reflection layer 121 may be lower or higher than a second refractive index of the second reflection layer 122. For example, the first and second reflection layers 121 and 122 may be formed of a pair of $ZrO/SiO_2$ layers. Herein, the refractive indices of the first and second reflection layers 121 and 122 may be lower than at least the refractive index of gallium nitride (GaN).

The refractive index of $SiO_2$ is 1.46, the refractive index of $Si_3N_4$ is 2.05, the refractive index of SiON is 1.46-2.05, the refractive index of $TiO_2$ is 2.49-2.90, the refractive index of $Al_2O_3$ is 1.77, and the refractive index of ZrO is 1.90.

The buffer layer 130 is formed on the substrate 110 and the multi-reflection layer 120. The undoped semiconductor layer 140 may be formed on the buffer layer 130. The buffer layer 130 functions to reduce a lattice constant difference from the substrate 110, and may comprise a GaN buffer layer, an AlN buffer layer, an AlGaN buffer layer, an InGaN buffer layer, or the like. The buffer layer 130 may have an uneven surface. An undoped GaN layer may be used as the undoped semiconductor layer 140. At least one of the buffer layer 130 and the undoped semiconductor layer 140 may be formed or none of them may be formed.

At least one first conductive type semiconductor layer 150 is formed on the undoped semiconductor layer 140. An n-type semiconductor layer doped with n-type dopant may be used for the first conductive type semiconductor layer 150. The n-type semi-conductor layer may be selected from GaN, AlGaN, InN, AlN, AlInN, InGaN, InAlGaN, and so forth. The n-type dopant may be selected from Si, Ge, Sn, Se, Te, etc.

The active layer 160 having a single or multi quantum well structure is formed on the first conductive semiconductor layer 150. The active layer 160 comprises, for example, a quantum well layer formed of InGaN and a quantum barrier layer formed of GaN, which are alternately formed. Here, the quantum well layer has a composition of $In_xGa_{1-x}N$ ($0 \leq x \leq 1$), however, is not limited thereto. The active layer 160 may change its light emitting wavelength and semiconductor material according to a light emitting material. Upon/under the active layer 160, p-type/n-type clad layers may be formed.

At least one second conductive type semiconductor layer 170 is formed on the active layer 160. A p-type semiconductor layer doped with p-type dopant may be used for the second conductive type semiconductor layer 170. The p-type semiconductor layer may be selected from GaN, AlGaN, InN, AlN, AlInN, InGaN, InAlGaN, and so forth. The p-type dopant may be selected from Mg, Zn, Ca, Sr, Ba, etc.

A transparent electrode layer or/and a third conductive type semiconductor layer may be formed on the second conductive type semiconductor layer 170. The third conductive semiconductor layer may be formed of an n-type semiconductor or a p-type semiconductor depending on an N-P-N junction structure or a P-N-P junction structure. A stack structure provided with the first conductive type semiconductor layer 150, the active layer 160 and the second conductive type semiconductor layer 170 may be defined as a light emitting structure. The light emitting structure may have one of an N-P junction structure, an N-P-N junction structure, a P-N junction structure, and a P-N-P structure.

In the embodiment, the substrate 110 under the buffer layer 130 and the multi-reflection layer 120 may be removed through a laser lift off (LLO) method.

A first electrode layer 171 is formed on the first conductive type semiconductor layer 150, and a second electrode layer 173 is formed on the second conductive type semi-conductor layer 170.

The multi-reflection layer 120 reflects a portion of light, which is emitted from the active layer 160 and progresses toward the substrate 110, by the use of the reflection layers 121 and 122 with different refractive indices, thus making it possible to improve light extraction efficiency and external quantum efficiency.

FIGS. 2 to 8 are views illustrating a method of fabricating the semiconductor light emitting device according to the first embodiment.

Referring to FIGS. 2 and 3, reflection layers 121 and 122 with different refractive indices are alternately stacked on a substrate 110. Here, the stacking of the reflection layers 121 and 122 may be performed by selectively using plasma vapor deposition (PVD) such as e-beam evaporation, thermal evaporation and magnetron sputtering (RF/DC sputtering), or chemical vapor deposition (CVD) such as plasma enhanced CVD (PECVD), low-pressure CVD (LPCVD) and atmospheric CVD (APCVD), however, the stacking of the reflection layers 121 and 122 is not limited thereto.

For example, the reflection layers 121 and 122 are alternately formed in such a way that the first reflection layer 121 of a first reflective material is formed, and the second reflection layer 122 of a second reflective material is then formed. Here, the first and second reflection layers 121 and 122 form one pair, and 2-50 pairs of reflection layers may be formed in total. The number of the first reflection layers 121 may be equal to or different from that of the second reflection layers 122. Instead of one pair of the reflection layers, one group of 2-6 number of reflection layers may be used.

The first reflection layer 121 may be formed of a material of which a refractive index is higher or lower than that of a material used for the second reflection layer 122. Each of the reflection layers 121 and 122 may be formed of at least one material of $SiO_2$, $Si_3N_4$, SiON, $TiO_2$, $Al_2O_3$, and ZrO. The first and second reflection layers 121 and 122 may be formed of different reflective materials or materials having different refractive indices. The refractive index of $SiO_2$ is 1.46, the refractive index of $Si_3N_4$ is 2.05, the refractive index of SiON is 1.46-2.05, the refractive index of $TiO_2$ is 2.49-2.90, the refractive index of $Al_2O_3$ is 1.77, and the refractive index of ZrO is 1.90. Here, the first and second reflection layers 121 and 122 may comprise a material of which a refractive index is lower than that of gallium nitride (GaN).

Referring to FIG. 4, photoresist patterns 128 are formed on the uppermost first reflection layer 121 of the reflection layers 121 and 122. Here, the photoresist patterns 128 may be formed through photoresist coating process, soft baking process (e.g., heating at 90-190° C.), UV exposure process, developing process, and hard baking process (e.g., heating at 90-120° C.) in sequence. The photoresist patterns 128 are spaced apart from each other by a predetermined distance.

Referring to FIGS. 4 and 5, the photoresist pattern 128 may be changed into a hemi-spherical pattern 128A through reflow baking process. Here, the reflow baking process may be performed at a temperature (e.g., 110-220° C.) higher than the temperature of the soft or hard baking process. Through the reflow baking process, the photoresist pattern 128 is changed into the hemispherical photoresist pattern 128A. Factors determining the shape of the hemispherical photoresist pattern 128A is a kind of the photoresist, reflow baking temperature, time, etc.

Referring to FIGS. 5 and 6, when the hemispherical photoresist pattern 128A is formed on the reflection layers 121 and 122, the reflection layers 121 and 122 are etched. The photoresist pattern 128A is also etched when the reflection layers 121 and 122 are etched. Accordingly, patterns of the reflection layers 121 and 122 may be formed on the substrate 110. A method of forming the multi-reflection layer 120, i.e., the reflection layers 121 and 122, by etching the photoresist pattern 128A may be performed using, for example, a dry etching process using high-density plasma. Examples of available plasma may be inductively coupled plasma (ICP), capacitively coupled plasma (CCP), electron cyclotron resonance (ECR) plasma, microwave plasma, helicon, or the like. Although an available gas source may slightly differ according to a medium, chlorine-based gas (e.g., $Cl_2$, $BCl_3$), fluorine-based gas (e.g., $CF_4$, $SF_6$, $NF_3$, $C_2F_6$), or inert gas (e.g., Ar, $N_2$) may be used as the gas source.

Referring to FIG. 7, after the patterns of the multi-reflection layer 120 are formed on the substrate 110, a buffer layer 130 is formed on the multi-reflection layer 120, and an undoped semiconductor layer 140 is formed on the buffer layer 130. Here, the surface of the buffer layer 130 may not be even, and the surface of the undoped semiconductor layer 130 may not be even. For planarization, a growth temperature and growth thickness can be adjusted.

The buffer layer 130 can relieve a lattice mismatch between a GaN material and a substrate material, and may be formed of at least one of GaN, AlGaN, InN, AlN, AlInN, InGaN and InAlGaN. The undoped semiconductor layer 140 may be formed of undoped GaN where conductive dopant is not added. The undoped semiconductor layer 140 serves as a substrate on which a nitride semiconductor grows. The buffer layer 130 and/or the undoped semiconductor layer 140 may not be formed, or may not exist in a final device.

A first conductive type semiconductor layer 150 is formed on the undoped semi-conductor layer 140, an active layer 160 is formed on the first conductive type semi-conductor layer 150, and a second conductive type semiconductor layer 170 is formed on the active layer 160. Here, the first conductive type semiconductor layer 150 may comprise at least one of n-type semiconductor layers. The active layer 160 may have a single or multi quantum well structure. The second conductive type semiconductor layer 170 may comprise at least one of p-type semiconductor layers.

A transparent electrode layer (not shown) or/and a third conductive semiconductor layer may be formed on the second conductive type semiconductor layer 170. The third conductive type semiconductor layer comprises an n-type semiconductor layer or a p-type semiconductor layer. Also, the substrate under the multi-reflection layer 120 may be removed through an LLO method.

Referring to FIG. 8, a portion of the first conductive type semiconductor layer 150 is exposed through mesa etching process. A first electrode layer 171 is formed on the first conductive type semiconductor layer 150, and a second electrode layer 173 is formed on the second conductive type semiconductor layer 170.

When a forward current is applied through the first and second electrode layers 171 and 173, light is emitted from the active layer 160. A portion of the light progressing toward the substrate 110 is reflected by the first reflection layer 121 or/and the second reflection layer 122 of the multi reflection layer 120. The light reflected by the reflection layers 121 and 122 changes a critical angle, and thus is emitted to the outside.

The semiconductor light emitting device 100 reflects (i.e., scattered reflection) a portion of light using the multi-reflection layer 120 on the substrate 110, thereby making it possible to improve light extraction efficiency and external quantum efficiency.

The semiconductor light emitting device of the embodiment can increase the crystallinity of a semiconductor thin film by disposing the multi-reflection layer with an uneven structure on the substrate.

FIG. 9 is a side sectional view illustrating a semiconductor light emitting device according to a second embodiment. FIG. 10 is an enlarged view of a portion A in FIG. 9.

Referring to FIGS. 9 and 10, the semiconductor light emitting device 200 comprises a multi-reflection layer 220 having an uneven surface on a substrate 210.

The multi-reflection layer 220 may have a stack structure comprising first and second reflection layers 221 and 222 with different refractive indices. The first and second reflection layers 221 and 222 form a pair of reflection layers, and the multi-reflection layer 220 may comprise 2-50 number of pairs of reflection layers.

The multi-reflection layer 220 is formed in a stripe shape, of which a shape may be a polyprism (e.g., quadratic prism, hexagonal prism), or a polyhedron (e.g., tetrahedron).

Here, the first and second reflection layers 221 and 222 may be formed of at least one material of $SiO_2$, $Si_3N_4$, SiON, $TiO_2$, $Al_2O_3$, and ZrO, and the first and second reflection layers 221 and 222 may be formed of different materials or materials having different refractive indices. The refractive index of $SiO_2$ is 1.46, the refractive index of $Si_3N_4$ is 2.05, the refractive index of SiON is 1.46-2.05, the refractive index of $TiO_2$ is 2.49-2.90, the refractive index of $Al_2O_3$ is 1.77, and the refractive index of ZrO is 1.90. Herein, the first and second reflection layers 221 and 222 comprise materials having a refractive index lower than that of gallium nitride (GaN).

The multi-reflection layer 220 may be achieved by forming patterns of the multi-reflection layer 220 using a photoresist pattern. The detailed description for it has been made with reference to the first embodiment, and the multi-reflection layer 220 can be realized within the technical scope of the embodiment.

A buffer layer 230, an undoped semiconductor layer 240, a first conductive type semiconductor layer 250, an active layer 260, and a second conductive type semi-conductor layer 270 may be sequentially formed on the substrate 210 and the multi-reflection layer 230. Here, the buffer layer 230 may be formed on the substrate 210 and the multi-reflection layer 220, and the undoped semiconductor layer may be formed to a thickness ranging from 3 μm to 6 μm.

The thickness of each of the first and second reflection layers 221 and 222, which are media with different refractive indices in the multi-reflection layer 220, may be a quarter of the wavelength of the light emitting device. The thickness of each reflection layer can be calculated by following Equations:

$$T_{ZrO} = \frac{1\lambda}{4n_{ZrO}}$$

$$T_{SiO_2} = \frac{1\lambda}{4n_{SiO_2}}$$

where T represents the thickness of each medium, λ represents a wavelength of the light emitting device, and n represents a refractive index.

The semiconductor light emitting device 200 can reflect light, which is emitted from the active layer 260 and progresses toward the substrate 110, by the multi-reflection layer 220. The multi-reflection layer 220 reflects light progressing toward the substrate 110 using the first reflection layer 221 or the second reflection layer 222, thereby changing a critical angle of the light. Accordingly, the light extraction efficiency and the external quantum efficiency of the semiconductor light emitting device 200 can be improved.

In the embodiment, the multi-reflection layer with the uneven surface is disposed on the substrate so that the crystallinity of the semiconductor thin film can be increased. In addition, it is possible to improve the external quantum efficiency using the scattered reflection of the multi-reflection layer.

The embodiment is also applicable to a semiconductor light emitting device having a horizontal or vertical electrode structure.

Hereinafter, a semiconductor light emitting device and a method of fabricating the same according to embodiments will be described in detail with reference to the accompanying drawings. In the description of embodiments, it will be understood that when a layer (or film), region, pattern or structure is referred to as being 'on another layer (or film), region, pad or pattern, the terminology of 'on' and 'under comprises both the meanings of 'directly on/under and 'indirectly on/under'. Further, the reference about 'on and 'under each layer will be made on the basis of drawings. Also, the thickness of each layer in the drawings is an example, and is not limited thereto.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The embodiment can provide a semiconductor light emitting device that can improve external quantum efficiency.

The embodiment can provide a semiconductor light emitting device that is variously applicable to a high-speed switching device, an illumination, or a light source of a display device.

The embodiment can provide a semiconductor light emitting device with enhanced reliability.

The invention claimed is:

1. A semiconductor light emitting device comprising:
a multi-reflection layer comprising at least two reflection layers with different refractive indices, wherein the multi-reflection layer comprises a hemispherical shape;
a first conductive type semiconductor layer on the multi-reflection layer;
an active layer on the first conductive type semiconductor layer; and
a second conductive type semiconductor layer on the active layer.

2. The semiconductor light emitting device according to claim 1, wherein each reflection layer of the multi-reflection layer comprises at least one of $SiO_2$, $Si_3N_4$, SiON, $TiO_2$, $Al_2O_3$, and/or ZrO.

3. The semiconductor light emitting device according to claim 1, wherein the multi-reflection layer comprises a first reflection layer with a first refractive index, and a second refractive index with a second refractive index disposed on or/and under the first reflection layer, the first and second reflection layers being alternately formed.

4. The semiconductor light emitting device according to claim 1, wherein each reflection layer of the multi-reflection layer is formed of a material having a refractive index lower than a refractive index of gallium nitride (GaN).

5. The semiconductor light emitting device according to claim 1, wherein the multi-reflection layer comprises 2-50 pairs of reflection layers, the pair of reflection layers comprising at least two reflection layers with different refractive indices.

6. The semiconductor light emitting device according to claim 1, wherein a thickness of each reflection layer of the multi-reflection layer is a quarter of a light emitting wavelength or ranges from 10 nm to 500 nm.

7. The semiconductor light emitting device according to claim 1,
further comprising a substrate under the multi-reflection layer.

8. The semiconductor light emitting device according to claim 1, comprising a buffer layer on the multi-reflection layer,
wherein an upper surface of the buffer layer is formed with a shape corresponding to the shape of the multi-reflection layer.

9. A method of fabricating a semiconductor light emitting device, the method comprising:
alternately forming reflection layers having different refractive indices on a substrate;
forming a photoresist pattern on an uppermost layer of the reflection layers;
performing a reflow heating process on the photoresist pattern to form a hemispherical photoresist pattern;
etching the reflection layers along the photoresist pattern to form a hemispherical multi-reflection layer including the reflection layers;
forming a first conductive type semiconductor layer on the substrate and the multi-reflection layer;
forming an active layer on the first conductive type semiconductor layer; and
forming a second conductive type semiconductor layer on the active layer.

10. The method according to claim 9, wherein each reflection layer of the multi-reflection layer comprises at least one of $SiO_2$, $Si_3N_4$, SiON, $TiO_2$, $Al_2O_3$, and/or ZrO.

11. The method according to claim 9, wherein the multi-reflection layer comprises 2-50 pairs of reflection layers, the pair of reflection layers comprising a plurality of reflection layers with different refractive indices.

12. The method according to claim 9, further comprising:
forming a buffer layer on the multi-reflection layer,
wherein an upper surface of the buffer layer is formed with a shape corresponding to the shape of the multi-reflection layer.

13. A semiconductor light emitting device comprising:
a substrate;
a multi-reflection layer on the substrate and comprising at least two reflection layers with different refractive indices;
a first conductive type semiconductor layer on the multi-reflection layer;
an active layer on the first conductive type semiconductor layer; and
a second conductive type semiconductor layer on the active layer,
wherein the multi-reflection layer directly contacts the substrate,
wherein the multi-reflection layer has a first multi-reflection layer and a second multi-reflection layer, and wherein the first multi-reflection layer is spaced apart from the second multi-reflection layer.

14. The semiconductor light emitting device according to claim 13, further comprising a buffer layer on the multi-reflection layer.

15. The semiconductor light emitting device according to claim 13, wherein the first multi-reflection layer has a first reflection layer and a second reflection layer, and
wherein a diameter of the first reflection layer differs from a diameter of the second reflection layer.

16. The semiconductor light emitting device according to claim 13, wherein the first multi-reflection layer has a first reflection layer and a second reflection layer, and
wherein a material of the first reflection layer differs from a material of the second reflection layer.

17. The semiconductor light emitting device according to claim 13, wherein the first conductive type semiconductor layer comprises at least one of a GaN layer, an InGaN layer, and/or an AlGaN layer, and
wherein the second semiconductor layer comprises an AlGaN layer.

18. The semiconductor light emitting device according to claim 14, wherein an upper surface of the buffer layer is formed with a shape corresponding to the shape of the multi-reflection layer.

19. The semiconductor light emitting device according to claim 13, wherein each reflection layer of the multi-reflection layer comprises at least one of $SiO_2$, $Si_3N_4$, SiON, $TiO_2$, $Al_2O_3$, and/or ZrO.

20. The semiconductor light emitting device according to claim 13, wherein each reflection layer of the multi-reflection layer is formed of a material having a refractive index lower than a refractive index of gallium nitride (GaN).

* * * * *